United States Patent [19]

Zampini

[11] Patent Number: 5,419,995
[45] Date of Patent: May 30, 1995

[54] PHOTORESIST COMPOSITION WITH ALTERNATING OR BLOCK COPOLYMER RESINS AND POSITIVE-WORKING O-QUINONE DIAZIDE OR NEGATIVE-WORKING AZIDE SENSITIZER COMPOUND

[75] Inventor: Anthony Zampini, Westborough, Mass.

[73] Assignee: Shipley Company Inc., Marlborough, Mass.

[21] Appl. No.: 61,369

[22] Filed: May 13, 1993

Related U.S. Application Data

[63] Continuation of Ser. No. 661,125, Feb. 27, 1991, Pat. No. 5,238,776, which is a continuation-in-part of Ser. No. 411,670, Sep. 25, 1989, abandoned, which is a continuation of Ser. No. 108,192, Oct. 13, 1987, abandoned, which is a continuation-in-part of Ser. No. 2,364, Dec. 23, 1986, abandoned.

[51] Int. Cl.$^6$ .......................... G03F 7/012; G03F 7/023
[52] U.S. Cl. ............................ 430/192; 430/165; 430/167; 430/193; 430/197
[58] Field of Search ............... 430/192, 193, 197, 165, 430/167; 525/480, 491, 503; 528/212, 218, 86, 88, 89

[56] References Cited

U.S. PATENT DOCUMENTS

| | | | |
|---|---|---|---|
| 2,437,710 | 3/1948 | Rhodes | 525/480 |
| 4,377,631 | 3/1983 | Toukhy et al. | 430/192 |
| 4,529,682 | 7/1985 | Toukhy | 430/192 |
| 4,587,196 | 5/1986 | Toukhy | 430/192 |
| 4,614,826 | 9/1986 | Katayama et al. | 549/559 |
| 4,690,882 | 9/1987 | Tanigaki et al. | 430/192 |
| 4,837,121 | 6/1989 | Blakeney et al. | 430/192 |
| 5,238,776 | 8/1993 | Zampini | 430/192 |

FOREIGN PATENT DOCUMENTS

| | | | |
|---|---|---|---|
| 0118291 | 9/1984 | European Pat. Off. | |
| 0273026 | 6/1988 | European Pat. Off. | 430/193 |

*Primary Examiner*—Charles J. Bowers, Jr.
*Assistant Examiner*—Christopher G. Young
*Attorney, Agent, or Firm*—Robert L. Goldberg

[57] ABSTRACT

A photoresist comprising a light sensitive component and an alternating copolymer resin formed by condensing a preformed bishydroxymethylated compound and a reactive phenol, in the absence of an aldehyde. Additional useful resins may be formed by further reacting the alternating copolymer with a second reactive phenol in the presence of an aldehyde to form substantially block copolymers. The use of these resins in photoresist formulations leads to improved thermal properties, etch resistance and photospeed.

14 Claims, No Drawings

PHOTORESIST COMPOSITION WITH ALTERNATING OR BLOCK COPOLYMER RESINS AND POSITIVE-WORKING O-QUINONE DIAZIDE OR NEGATIVE-WORKING AZIDE SENSITIZER COMPOUND

CROSS REFERENCE TO RELATED APPLICATIONS

This is a continuation of copending application(s) Ser. No. 07/661,125 filed on Feb. 27, 1991, U.S. Pat. No. 5,238,776, which is a continuation in part of U.S. patent application Ser. No. 07/411,670 filed Sep. 25, 1989, now abandoned, which application in turn is a continuation of U.S. patent application Ser. No. 07/108,192 filed Oct. 13, 1987 (now abandoned) which latter application is a continuation in part of U.S. patent application Ser. No. 002,364 filed Dec. 23, 1986 (now abandoned).

BACKGROUND OF THE INVENTION

1. Introduction

This invention relates to a photoresist composition comprising a light sensitive component admixed with alternating or block copolymer resins. The novel novolak resins may be formed from bishydroxymethylated phenols reacted with other reactive phenols to produce an alternating copolymer. Further reaction of the alternating copolymer, with different reactive phenols or mixtures of reactive phenols, in the presence of an aldehyde leads to the formation of block copolymer resins. The alternating or block copolymer resins of the present invention may be used alone or with a blend of resins in a photoresist composition.

2. Description of the Prior Art

Photoresist compositions are well-known in the art and described in numerous publications including DeForest, Photoresist Materials and Processes, McGraw Hill Book Company, N.Y., 1975. Photoresists comprise coatings produced from solution or applied as a dry film which, when exposed to light or the proper wave length, are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting resists work in the opposite fashion, light exposure making the resist soluble in developer.

Positive-working photoresists are more expensive than negative-working photoresists but are capable of providing superior image resolution. For example, the positive-working photoresist described above can be developed to yield relief images with a line width as low as one micron or less. In addition, considering the cross-section of a photoresist image, the channels formed in the resist by development have square corners and sidewalls with only minimal taper.

The positive-working resists comprise a light sensitive compound in a film-forming polymer binder. The light sensitive compounds, or sensitizers as they are often called, most frequently used are esters and amides formed from o-quinone diazide sulfonic and carboxylic acids. These esters and amides are well-known in the art and are described by DeForest, supra, pp. 47–55, incorporated herein by reference. These light sensitive compounds, and the methods used to make the same, are all well documented and prior patents including German Patent No. 865,140 granted Feb. 2, 1953 and U.S. Pat. Nos. 2,767,092; 3,046,110; 3,046,112; 3,046,119; 3,046,121; 3,046,122 and 3,106,465, all incorporated herein by reference. Additional sulfonic amide sensitizers that have been used in the formulation of positive-acting photoresists are shown in U.S. Pat. No. 3,637,384, also incorporated herein by reference. These materials are formed by the reaction of a suitable diazide of an aromatic sulfonyl chloride with an appropriate resin amine. Methods for the manufacture of these sensitizers and examples of the same are shown in U.S. Pat. No. 2,797,213, incorporated herein by reference. Other positive-working diazo compounds have been used for specific purposes. For example, a diazo compound used as a positive-working photoresist for deep U.V. lithography is Meldrum's diazo and its analogs as described by Clecak et al, Technical Disclosure Bulletin, Volume 24, No. 4, September 1981, IBM Corporation, pp. 1907 and 1908 and o-quinone diazide compounds suitable for laser imaging as shown in U.S. Pat. No. 4,207,107. The aforesaid references are also incorporated herein by reference.

A class of negative resists comprising a negative-acting sensitizer in a polymer binder is described by Iwayanagi et al, IEEE transactions on electron devices, volume ED-28, No. 11, November, 1981, incorporated herein by reference. The resists of this reference comprise an aromatic azide in a phenolic binder. It is believed that these resists are first disclosed and claimed in U.S. Pat. No. 3,869,292, also incorporated herein by reference. Additional aromatic azide sensitizers are disclosed by DeForest, supra, and U.S. Pat. Nos. 2,940,853 and 2,852,379, incorporated herein by reference.

The resin binders most frequently used with the o-quinone diazides in commercial practice are the alkali soluble phenol formaldehyde resins known as the novolak resins. Photoresists using such polymers are illustrated in U.K. Patent No. 1,110,017, incorporated herein by reference. These materials are the product of reaction of a phenol with formaldehyde under conditions whereby a thermoplastic polymer is formed.

Another class of binders used with both the negative-acting aromatic azides and the positive-acting o-quinone diazides are the homopolymers and copolymers of vinyl phenol. Photoresists of this nature are disclosed in U.S. Pat. No. 3,869,292, supra. It is believed that photoresists using binders of polymers formed from vinyl phenols have found limited use in commerce.

In the prior art, the above described positive resist using novolak resins as binders are most often used as mask to protect substrates from chemical etching and photo-engraving processes. For example, in a conventional process for the manufacture of printed circuit board, a copper-clad substrate is coated with a layer of a positive working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by the development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer and must be capable of very fine line image resolution.

Recent developments in photoresist technology involve processes where high temperatures are encountered. For example, a recent development in the fabrication of semiconductors substitutes dry plasma etching for wet chemical etching to define a circuit. Plasma etching provides advantages of a wet chemical etching in that it offers process simplification and improves dimensional resolution and tolerance. However, the demands on the resists are significantly greater when using plasma etching. For both wet etching and plasma etching, the resist must adhere to the substrate and must be capable of fine line image resolution. For plasma etching, in addition to these properties, the resists must often be capable of withstanding high temperatures without image deformation and without eroding as plasma etching generates high temperatures at the wafer's surface.

The above described prior art positive-working resists provide good resistance to chemical etchants and fine line image resolution. However, they soften and begin to flow at temperatures somewhat in excess of about 120° C. thereby resulting in image distortion and poor image resolution.

The photoresists of the present invention are characterized by the use of alternating and block copolymer resins which are especially suitable for use as high resolution resists. The resins when incorporated into a photoresist composition provide high thermal resistance, high etch resistance, good film forming properties, and improved photospeed.

SUMMARY OF THE INVENTION

The subject invention is directed to photoresist compositions useful for the same purposes as prior art photoresists. The photoresists may be positive-acting or negative-acting photoresists, dependent upon the selection of the sensitizer. The photoresist comprises a sensitizer such as a diazo compound or an azide compound in a resin binder comprising the condensation product of a preformed bishydroxymethyl phenol with another reactive phenol in the absence of an aldehyde to form the alternating copolymer. Additionally, block copolymer resins are formed by further reacting the alternating copolymer with another phenol or mixture of phenols in the presence of an aldehyde. The resin binder may also include other resins incorporated into the binder—i.e., those prepared by the reaction of a phenol with formaldehyde in the presence of an acid catalyst.

The new resins used as binders for the photoresists are characterized by a narrow molecular weight distribution. Normally, the ratio of the weight average molecular weight to number average molecular weight is in the range of 3 to 4 units or lower. The novel resins are also characterized by enhanced ortho-, ortho- coupling. This type coupling is normally not dominant in prior art acid catalyzed reactions which form random copolymers.

The novel resins are compatible with conventional novolak resins and other resins including phenolic resins to provide new polymer mixtures exhibiting high resolution and thermal characteristics.

DESCRIPTION OF THE PREFERRED EMBODIMENTS

As described above, the invention is directed to a photoresist composition that comprises an admixture of a light sensitive compound and novel alkali soluble novolak resins. The novel resins include both alternating copolymer resin binders and other useful resin binders formed by further reacting the alternating copolymer with a second reactive phenol or mixtures of phenols, in the presence of formaldehyde, to form a substantially block copolymer resin binder.

The alternating and block novolak resins of the present invention are condensation products of preformed bishydroxymethylphenol with reactive phenols. The preformed bishydroxymethylated phenolic compounds that are particularly useful in this invention are represented by the following structure:

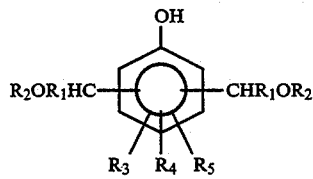

where:
$R_1$ is hydrogen, an alkyl, an aryl, or a hetero-cyclic group, but preferably is H;
$R_2$ is hydrogen, an alkyl or an acyl group, but preferably is hydrogen or methyl;
$R_3$ and $R_5$ are hydrogen, halogen, an alkyl group free of a tertiary alpha-carbon atom, an alkoxy group having 1 to 4 carbon atoms, a phenoxy group, any aryl group or an arylalkyl group; and
$R_4$ is the same as $R_3$ and $R_5$, and in addition is a carboxylic group.

These preformed bishydroxymethyl phenols may be formed by the reaction of formaldehyde with o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid, p-nitro phenol and the like, in the presence of a base. Suitable bases which will promote the reaction include sodium or potassium hydroxide.

The bishydroxymethyl groups of the above preformed phenolics are reactive and may in the presence of heat, acid or base react with other bishydroxymethyl groups present in the reaction, or with another reactive compound. If the reactive compound is another phenolic material, such as phenol, cresols, dimethylphenols, trimethylphenols, napthols, biphenols, phenylphenols, bis(hydroxyphenyl)methane, isopropylidenebiphenols, catechols, resorcinols, thiobiphenols and the like, which contains at least two sites in the aromatic ring(s) of sufficient reactivity to undergo facile Friedel-Crafts reactions, then the condensation reaction of the reactive compound with the preformed bishydroxymethylated phenolic compound will sustain polymerization and result in the formation of the alternating copolymers of the present invention. The key to the formation of these alternating copolymers is the absence of any aldehyde from the reaction.

To prepare polymers having utility in photoresists compositions, the bishydroxymethylated phenolic compound and the reactive phenolic compound are dissolved in an appropriate non-reactive or non-interfering solvent and an acid catalyst is added. No aldehyde compounds are present during the formation of the alternating copolymers. When a volatile reactive phenolic compound is used in excess, it may also serve as a solvent or cosolvent. The condensation reaction leading to polymer formation can be carried out below, at or above ambient temperature. It is generally more practical to conduct the reaction at elevated temperature. A suitable acid catalyst may be a mineral acid such as hydrochloric acid, sulfuric acid, phosphoric acid, or an organic acid such as oxalic acid, maleic acid, formic acid, toluenesulfonic acid and the like. In certain cases, an inorganic catalyst may also be used. These may include compounds of zinc, manganese, magnesium, aluminum, titanium, copper, nickel and cobalt. Upon completion of the condensation reaction, the solvent and unreacted reactive phenolic compound may be removed via volatilization under reduced pressure and elevated temperature. The preferred method by which the polymer may be recovered from the reaction mixture is by precipitation of the polymer into liquid which is a non-solvent for the polymer but a solvent for the reaction solvent, catalyst and unreacted reactants. If this precipitation approach is used, the polymer is dried at elevated temperatures under reduced pressure. The resulting polymer is substantially an alternating copolymer structure.

The substantially alternating copolymer, produced by the above described acid catalyzed condensation reaction of a bishydroxymethylated phenolic compound and a reactive phenol, can be further reacted with a second reactive phenol or mixture of phenols. When the reaction is carried out in the presence of an acid and an aldehyde, the resulting resin is substantially a block copolymer. When the alternating block copolymers are formed using aromatic aldehydes, they are also characterized by elevated glass transition temperatures.

These block copolymers are characterized by controlled amount of at least one of the reactive phenols present. For example, when reacting m-cresol with 2,6-bis(hydroxymethyl)-4-methylphenol (dimethylol p-cresol), the only source of p-cresol in the polymer will be the dimethylol p-cresol. Assuming complete consumption of the dimethylol p-cresol, the polymer will be characterized by a known amount of p-cresol present in the block copolymer.

The choice of second reactive phenol compounds for formation of the block copolymer may be from the same groups as used in the formation of the alternating copolymer. These compounds include phenol, cresols, dimethylphenols, trimethylphenols, napthols, biphenols, phenylphenols, bis(hydroxyphenyl)methane, isopropylidenebiphenol, catechols, resorcinols, thiobiphenols or mixtures thereof, which contain at least two sites in the aromatic ring(s) of sufficient reactivity. The choice of aldehydes for the reaction include any aldehyde containing the RCHO functionality, including alkyl aldehydes and aromatic aldehydes. Preferred aldehydes include formaldehyde, benzaldehyde, salicylaldehyde or mixtures thereof.

The following specific examples will better illustrate a method for the preparation of novel alternating and block copolymer resins and photoresist compositions using these novel resins, and are not to be taken as limitations to the practice of the invention.

EXAMPLE 1—A Resin Formed from meta-cresol and 2,6-Bis(hydroxy-methyl)-p-cresol

A 2-L four-neck resin kettle equipped with a stirrer, heating source, thermometer, variable reflux ratio distilling head and a nitrogen inlet tube was charged with 129.8 g m-cresol, 134.5 g 2,6-bis(hydroxymethyl)-p-cresol, 20 ml deionized water, 5.0 g oxalic acid dihydrate and 50 ml ethyl cellosolve acetate. The mixture was heated to about 60° C. at which point an exothermic condensation reaction ensued. The reaction was allowed to continue for about 4 hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mm Hg was achieved and the mixture was at about 228° C. The liquefied resin remaining in the kettle was poured into a tray under nitrogen and allowed to cool and solidify. About 217 g of an alternating resin having a number average molecular weight, $M_n$, of 1640 Daltons and a Tg of 106° C. were obtained.

EXAMPLE 2—A Resin Formed from m-Cresol and 2,6-Bis(hydroxy-methyl)-p-cresol and Formaldehyde A phenolic resin rich in alternating phenolic copolymer block segments was formed by reacting a mixture of 519.0 g of 99 percent pure m-cresol, 538.2 g 97 percent pure 2,6-bis(hydroxy-methyl)-p-cresol and 20 g oxalic acid dihydrate in a solvent mixture of 40 ml deionized water and 200 ml ethyl cellosolve acetate. The reaction mixture was heated to about 70° C. to initiate the reaction forming the alternating copolymer. At 102° C. 32 6 g of 36 9 percent formaldehyde was added in 8 minutes to the reaction mixture to form substantially m-cresolformaldehyde block segments and to chemically bond these segments to the previously formed alternating copolymer. After heating the mixture at reflux for three hours, the amount of heat was increased to remove the water and solvent by distillation. Partial vacuum was applied at about 220° C. and gradually increased to 4 mm Hg to remove the unreacted monomers. Maximum mixture temperature during vacuum stripping was about 226° C. The copolymer was poured from the reaction kettle and allowed to cool. About 840 g of a block copolymer having a number average molecular weight number, Mn, of 1241 Daltons and a Tg of 112° C. were obtained.

EXAMPLE 3—A Resin Formed from m-Cresol, 2,60Bis(hydroxy-methyl)-p-cresol and 1-Naphthol A mixture comprising of 72.1 g 1-naphthol, 84.1 g 2,6-bis(hydroxymethyl)-p-cresol, 5.0 g oxalic acid dihydrate and 150 ml ethyl cellosolve acetate in a 0.5-L resin kettle, equipped as in Example 1, was heated to initiate the condensation reaction substantially forming the 1-naphthol-methylene-p-cresol alternating copolymer. An exothermic reaction resulted, reaching a peak temperature of about 120° C. The reaction mixture was allowed to reflux for about 2 hours, 108.1 g m-cresol and 48.8 g of 36.9 percent formaldehyde were added, and the condensation mixture again allowed to reflux for about 2 hours. The volatiles present in the reaction mixture were removed by distillation and stripping as described in Example 1. About 201 g of a block copolymer having a number average molecular weight, $M_n$, of 1940 Daltons and a Tg of about 121° C. were obtained.

EXAMPLE 4—A m-Cresol, Salicyladehyde and 2,6-Bis(hydroxy-methyl)-p-cresol resin

A mixture of 146.0 g m-cresol, 25.2 g 2,6-bis(hydroxymethyl)-p-cresol, 5.0 g 3-mercaptopropionic acid and 1.5 g p-toluene-sulfonic acid monohydrate in 200 ml glacial acetic acid were charged into a 1-L reaction vessel equipped with a paddle stirrer, reflux condenser and a nitrogen inlet tube. The mixture was heated to reflux and maintained at reflux to allow formation of the alternating copolymer. After 8 hours, 146.5 g salicylaldehyde were added over time to the reaction mixture to form substantially m-cresol-salicylaldehyde block segments. Reflux was continued for 8 hours. The reaction mixture was slowly poured into 7 L deionized water to precipitate the resin. Once the solvent had exchanged with water, the product was collected on a filter, slurried once in warm deionized water for about 30 minutes, again collected, rinsed with water and dried in a vacuum oven under about 125 mm Hg and at about 100 to 105° C. About 281 g of a block copolymer resin having a number average molecular weight, Mn, of 1472 Daltons and a Tg of 233° C. were obtained.

To formulate a photoresist using either the alternating or block copolymer resins of the present invention, a light sensitive compound is admixed with the resin using art recognized procedures. The light sensitive compound used may be any of the various light sensitive diazo or azide compounds known to be suitable as sensitizers in photoresists comprising an alkali soluble polymer binder. For example, the sensitizer may be positive-working o-quinone diazide compounds or negative-working azide compounds. The amount of sensitizer used and the manner of preparing the photoresist is in accordance with art recognized procedures. In this respect, dependent upon specific sensitizer and polymer combination, the sensitizer can vary from 0.1 to 50 weight percent of the photoresist composition and preferably varies between about 5 and 25 percent by weight of the formulation. The following example provides a means of preparing a suitable sensitizer for use with the present invention, but is not to be taken as a limitation as to the practice of the invention.

EXAMPLE 5—An Oxo-diazonaphthalene-sulfonate Mixed Ester of 2,3,4-Trihydroxybenzophenone To a 25 liter flask equipped with a constant temperature bath, thermometer, mechanical stirrer, and 2 one liter addition funnels were added 550 g (2.50 moles) of 2,3,4-trihydroxybenzophenone, 750 g (2.80 moles) of 1-oxo-2-diazonaphthalene-5-sulfonyl chloride and 11.350 liters of reagent grade acetone. While the mixture was maintained at 20° C. ±0.3° C., 1425 g (1.61 moles) of 12 percent sodium carbonate were added dropwise over 100 minutes. After the base addition, the reaction mixture was allowed to stir for 60 minutes at about 20° C. Two-hundred fifty (250) milliliters of concentrated HCl was then slowly added to the mixture while keeping its temperature below 26° C. The reaction solution was filtered to remove the bulk of the NaCl, and the filtrate was added to 50 milliliters of 1 percent HCl. The precipitated solid was stirred one hour, filtered and collected. The solid was slurried twice in 25 liters of deionized water, filtered and vacuum dried to 0.1 mm Hg at ambient temperature. About 1100 g (85 percent of the theory) of a yellow, free flowing product containing about 34 percent by weight triester were obtained. By changing the ratio of the 1-oxo-2-diazonaphthalene-5-sulfonyl chloride to 2,3,4-tri-hydroxybenzophenone, the percent by weight of triester in the photoactive compound product, and thus the percent by weight of photoactive compound molecules without acidic hydrophillic groups, can be adjusted as desired.

For use as a liquid coating composition, the photoresist components are admixed with the solvent together with other additives typically used in the prior art. Other phenolic resins are particularly suitable as additives such as for example, conventional novolak resins and polyhydroxycarbonyl condensates such as pyrogallol-acetone, polyvinyl phenols, vinyl phenol copolymers, etc. The solvent used to form the coating composition is any solvent typically used for this purpose including glycol ethers and acetates such as the propylene glycol methyl ether acetates and monooxymonocarboxylic acid esters such as ethyl lactate. A solution having a solids content of from about 5 to 40 percent by weight is suitable.

The method of using photoresists of the invention is also in accordance with prior art procedures. The most conventional methods comprise forming a film from solution by whirl coating, dipping, spraying, etc. The photoresists composition may also be applied as a dry film in accordance with art recognized procedures.

In addition to the light sensitive constituent, other constituents such as dyes, softeners and other resins may be used in a mixture with the novolak binder as is known in the art. A particularly useful class of additives is the polyvinyl ethers such as those disclosed in U.S. Pat. No. 3,634,082, incorporated herein by reference. These polymers may be added in amounts varying from 1 to 10 percent by weight of the resists. The preferred polyvinyl ether is polyvinylmethyl ether.

The photoresist compositions of this invention are applied to conventional substrates and conventional manners. For example, the photoresist may be applied to a copper clad substrate, a semiconductor, a silicon wafer, etc. by any of whirl coating, spraying, dipping or the like. Thereafter, the substrate is dried, imaged and developed by washing with an aqueous alkaline developer.

The following examples illustrate the preparation and use of photoresists in accordance with the invention. Examples 6 through 9 demonstrate positive working photoresist compositions containing the novel resins of this invention. The photoresist compositions were evaluated by spin coating onto four inch silicon wafers using an SVG coater-hot plate track to give a 1.2 micron film of photoresist and baked at 100° C. for 45 seconds. Initial average film thickness was measured with a Nanometrics Nanospec. The films were irradiated with UV light dosages of 30 to 300 mJ/cm$^2$ through a Ditric gradient density step tablet mask to give varying exposures on the photoresist surfaces. The compositions were developed in TMAH/water developer of concentrations between 0.050 and 0.299 molar at 22° C. The developed film thicknesses were measured and the normalized film thicknesses plotted against the logarithm of the exposure dose in order to generate a contrast curve. A straight line plot was obtained by extrapolation.

| EXAMPLE 6 | | |
|---|---|---|
| Composition: | Resin of Example 1 | 8.53 g |
| | PAC of Example 5 | 1.87 g |
| | Propylene glycol monomethyl ether acetate | 26.91 g |
| | Anisole | 9.78 g |
| Performance: | Photosensitivity, mJ/cm$^2$ | 35.9 |
| | Contrast | 2.19 |
| | Initial film thickness | 1.20 |
| EXAMPLE 7 | | |
| Composition: | Resin of Example 2 | 21.83 g |
| | PAC of Example 5 | 4.16 g |
| | Ethyl lactate | 52.88 g |
| | Anisole | 9.78 g |
| | Amyl acetate | 9.78 g |
| Performance: | Photosensitivity, mJ/cm$^2$ | 71.10 |
| | Contrast | 2.83 |
| | Initial film thickness | 1.132 |
| EXAMPLE 8 | | |
| Composition: | Resin of Example 3 | 21.80 g |
| | PAC of Example 5 | 5.45 g |
| | Ethylcellusolve acetate | 64.00 g |
| | n-Butyl acetate | 7.11 g |
| Performance: | Photosensitivity, mJ/cm$^2$ | 33.7 |
| | Contrast | 1.59 |
| | Initial film thickness | 1.228 |
| EXAMPLE 9 | | |
| Composition: | Resin of Example 4 | 10.39 g |
| | PAC of Example 5 | 2.47 g |
| | Ethyl lactate | 21.95 g |
| | Anisole | 10.98 g |
| | Amyl acetate | 3.66 g |
| Performance: | Photosensitivity, mJ/cm$^2$ | 125 |
| | Contrast | ~1.5 |
| | Initial film thickness | 1.20 |

What is claimed is:

1. A photoresist comprising an admixture of a binder and a sensitizer, said binder being an alkali soluble alternating copolymer resin that is the product of condensation of a bishydroxymethylated compound and a reactive phenol in the absence of an aldehyde, said resin having a weight average molecular weight to number average molecular weight ratio of 3 or lower, and said sensitizer comprising a binder compatible and developable material selected from the group consisting of positive-working o-quinone diazide compounds and negative-working azide compounds, said sensitizer being present in an amount sufficient to enable development following exposure of said photoresist to activating energy.

2. The photoresist of claim 1 wherein said sensitizer is an o-quinone diazide sulfonic acid ester or amide.

3. The photoresist of claim 1 wherein said bishydroxymethylated compound corresponds to the following formula:

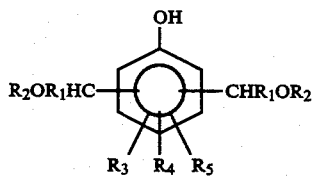

where:
R$_1$ is hydrogen, an alkyl, an aryl, or a heterocyclic group;
R$_2$ is hydrogen, an alkyl, or an acyl;
R$_3$ and R$^5$ are hydrogen, halogen, an alkyl group free of a tertiary alpha-carbon atom, an alkoxy group having 1 to 4 carbons, a phenoxy group, an aryl group or an arylalkyl group; and
R$_4$ is the same as R$_3$ and R5, or a carboxylic group.

4. The photoresist of claim 1 wherein said bishydroxymethylated compound is the reaction product of formaldehyde with a phenol selected from the group consisting of o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid and p-nitro phenol.

5. The photoresist of claim 1 wherein said reactive phenol is selected from the group consisting of phenol, cresols, dimethylphenols, trimethylphenols, napthols, biphenols, phenylphenols, bis(hydroxyphenyl)methane, isopropylidenebiphenols, catechols, resorcinols and thiobiphenols.

6. The photoresist of claim 5 wherein said reactive phenol is selected from the group consisting of o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid and p-nitro phenol.

7. The photoresist of claim 1 wherein the alternating copolymer resin is the product of condensation of reagents consisting essentially of one or more bishydroxymethylated compounds and one or more reactive phenols.

8. A photoresist comprising an admixture of a binder and a sensitizer, said binder being an alkali soluble block copolymer resin obtained by condensing a bishydroxymethylated compound and a reactive phenol in the absence of an aldehyde to form an alternating copolymer having a weight average molecular weight to number average molecular weight ratio of 3 or less, and then further reacting said alternating copolymer with a second reactive phenol in the presence of an alkyl aldehyde to form said block copolymer resin, and said sensitizer comprising a binder compatible and developable material selected from the group consisting of positive-working o-quinone diazide compounds and negative-working azide compounds, said sensitizer being present in an amount sufficient to enable development of said photoresist following exposure to activating energy.

9. The photoresist of claim 8 wherein said sensitizer is an o-quinone diazide sulfonic acid ester or amide.

10. The photoresist of claim 8 wherein said bishydroxymethylated compound corresponds to the following formula:

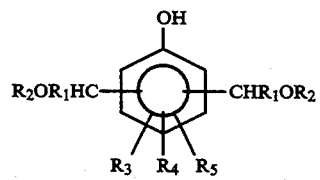

where $R_1$ is hydrogen, an alkyl, an aryl, or a heterocyclic group;

$R_2$ is hydrogen, an alkyl, or an acyl;

$R_3$ and $R_5$ are hydrogen, halogen, an alkyl group free of a tertiary alpha-carbon atom, an alkoxy group having 1 to 4 carbons, a phenoxy group, an aryl group or an arylalkyl group; and $R_4$ is the same as $R_3$ is the same as $R_3$ and $R_5$, or a carboxylic group.

11. The photoresist of claim 8 wherein said bishydroxymethylated compound is the reaction product of formaldehyde with a phenol selected from the group consisting of o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid and p-nitro phenol.

12. The photoresist of claim 8 wherein said first reactive phenol is selected from the group consisting of phenol, cresols, dimethylphenols, trimethylphenols, naphthols, biphenols, phenylphenols, bis(hydroxyphenyl)methane, isopropylidenebiphenols, catechols, resorcinols and thiobiphenols.

13. The photoresist of claim 8 wherein said second reactive phenol is selected from the group consisting of phenol, cresols, dimethylphenols, trimethylphenols, naphthols, biphenols, phenylphenols, bis(hydroxyphenyl)methane, isopropylidenebiphenols, catechols, resorcinols and thiobiphenols.

14. The photoresist of claim 8 wherein said aldehyde is formaldehyde.

* * * * *